(12) United States Patent
Hsuan et al.

(10) Patent No.: US 6,279,141 B1
(45) Date of Patent: Aug. 21, 2001

(54) PREBURN-IN DYNAMIC RANDOM ACCESS MEMORY MODULE AND PREBURN-IN CIRCUIT BOARD THEREOF

(76) Inventors: Min-Chih Hsuan, No. 12-4, Chu Tsun II Rd., Science-Based Industrial Park, Hsinchu City; Charlie Han, 5F., No. 8, Lane 327, Min Hsing Rd., Chutung Town, Hsinchu Hsien; Jerry Jaw, No. 42-1, Alley 20, Lane 467, Ching Hsin St., Chung Ho City, Taipei Hsien; Tung-Chi Liu, No. 1, Lane Shih Wei, Chu Shan Town, Nantou Hsien, all of (TW)

(*) Notice: Subject to any disclaimer, the term of this patent is extended or adjusted under 35 U.S.C. 154(b) by 0 days.

(21) Appl. No.: 09/434,987

(22) Filed: Aug. 13, 1997

(30) Foreign Application Priority Data

Jun. 21, 1997 (TW) ................................. 86108684

(51) Int. Cl.[7] ...................... G06F 17/50; G01R 31/26; G11C 29/00; H01L 21/66
(52) U.S. Cl. .................. 716/1; 365/201; 438/14; 324/765
(58) Field of Search .................... 716/1, 4, 15; 714/718, 714/721, 723, 733, 734; 365/201, 210, 211, 212; 438/14, 18; 324/755, 765, 766

(56) References Cited

U.S. PATENT DOCUMENTS

| | | | |
|---|---|---|---|
| 5,391,892 | * 2/1995 | Devereaux et al. | 257/48 |
| 5,461,328 | * 10/1995 | Devereaux et al. | 324/765 |
| 5,590,079 | * 12/1996 | Lee et al. | 365/201 |
| 5,886,535 | * 3/1999 | Budnaitis | 324/760 |

* cited by examiner

*Primary Examiner*—Matthew Smith
*Assistant Examiner*—Leigh Marie Garbowski
(74) *Attorney, Agent, or Firm*—Rabin & Champagne, P.C.

(57) ABSTRACT

A preburn-in DRAM module circuit board is provided, which allows a plurality of DRAM modules to be constructed directly thereon, and which can be directly connected to a large burn-in oven so as to perform a burn-in process concurrently on the DRAM modules mounted thereon to check for any defected IC chips that are to be reworked. After the burn-in process, each of the DRAM modules can be cut apart from the circuit board to serve as a single memory module. The preburn-in DRAM module circuit board allows the manufacturing process for the DRAM modules to be reduced in schedule and manufacturing cost. Material cost can also be saved since the burn-in circuit and the module circuit are arranged on the same circuit board.

14 Claims, 5 Drawing Sheets

PREBURN-IN DYNAMIC RANDOM ACCESS MEMORY MODULE AND PREBURN-IN CIRCUIT BOARD THEREOF

BACKGROUND OF THE INVENTION

1. Field of the Invention

This invention relates to DRAM (dynamic random access memory) modules, and more particularly, to a preburn-in DRAM module circuit board which is directly connectable to a burn-in oven for performing a burn-in process concurrently on a plurality of DRAM modules mounted thereon.

2. Description of Related Art

Figure 1:
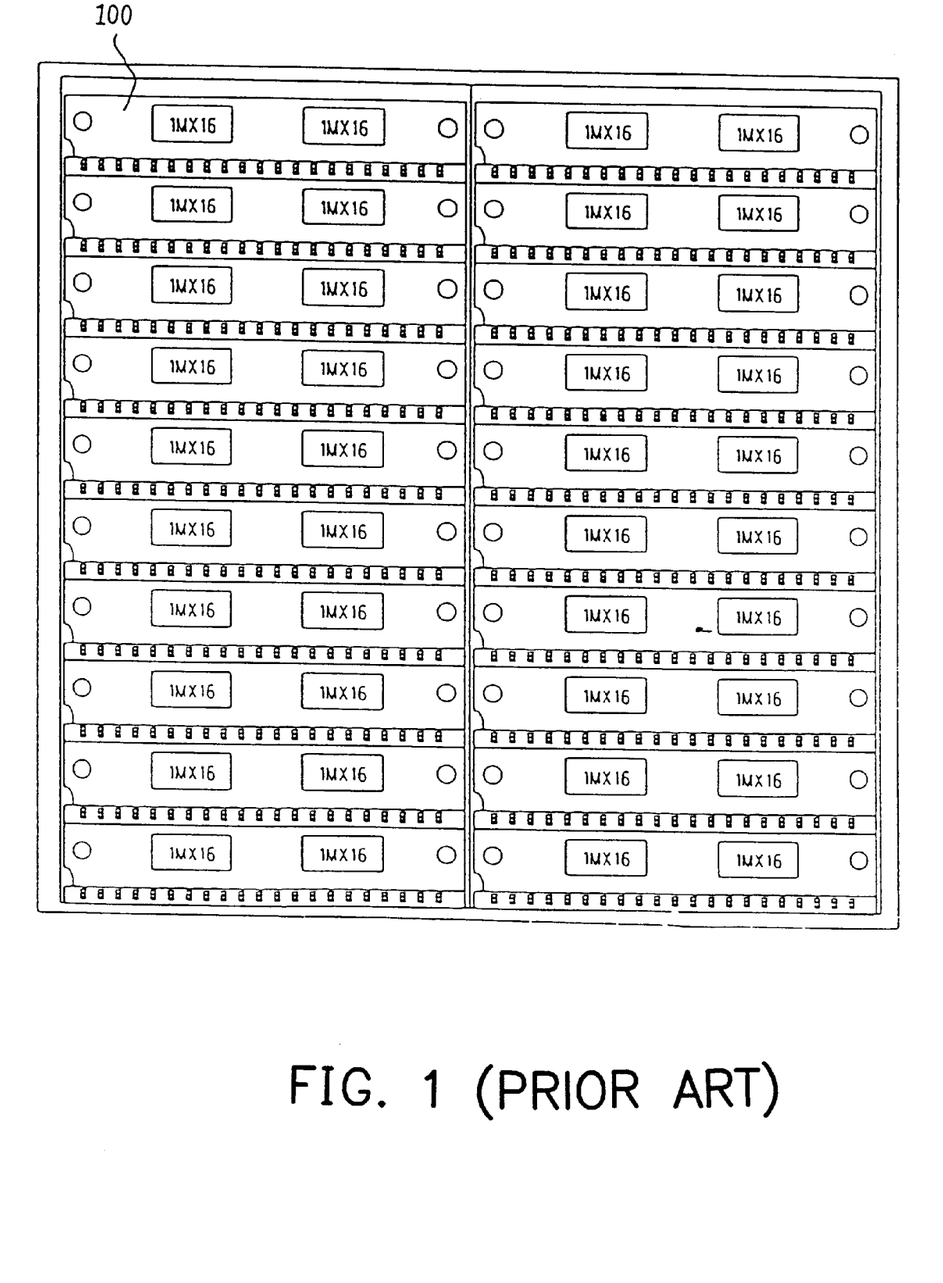
FIG. 1 shows a conventional DRAM module circuit board on which an array of DRAM modules are mounted.

FIG. 1 shows a conventional DRAM module circuit board which is mounted with an array of DRAM modules 100 thereon. Each of these DRAM modules 100 can be cut apart from the circuit board to function as a single memory unit. This conventional DRAM module circuit board is not provided with a burn-in circuit, so that the burn-in process for the DRAM modules 100 on the circuit board is performed for the DRAM modules 100 after they are cut apart from the circuit board.

Most conventional DRAM modules are manufactured by the following procedural steps: (1) wafer sorting, which is also called chip-probe (CP) testing; (2) IC package assembly; (3) final testing-1; (4) burn-in; (5) final testing-2; (6) module assembly; (7) module testing; and (8) shipping.

Some low-end DRAM modules are manufactured by a simplified procedure which includes the following steps: (1) wafer sorting (CP testing), (2) IC package assembly or chip-on-board, (3) module assembly, (4) module system burn-in, (5) module testing, and (6) shipping.

Conventional manufacturing processes for DRAM modules have some drawbacks. First, the procedure is quite complex and time-consuming to complete. Second, the burn-in and module warm-up should be separately carried out, each process requiring one or two days to complete, which is quite inconvenient and time-consuming. Third, the circuit board used for the burn-in process and that used for constructing the DRAM modules are separate ones, which means that the DRAM modules should be cut apart from the DRAM module circuit board and then mounted on a burn-in circuit board to undergo the burn-in process. The work involved is thus quite laborious and cost-ineffective. Fourth, the module warm-up process is applicable to one module only at a time, which is quite inefficient. Fifth, in the module warm-up process, the voltage and current can not be s suitably controlled, which can cause degradation to the IC quality and reliability.

SUMMARY OF THE INVENTION

It is therefore a primary objective of the present invention to provide a preburn-in DRAM module circuit board whose architecture represents a solution to the above-mentioned drawbacks of the prior art. In particular, the preburn-in DRAM module circuit board of the invention allows a plurality of DRAM modules to be constructed directly thereon, and which can be directly connected to a large burn-in oven so as to perform a burn-in process concurrently on the DRAM modules mounted thereon to check for any defected IC chips that are to be reworked.

It is another objective of the present invention to provide a structure for the DRAM modules (hereinafter referred to as preburn-in DRAM module) that are to be constructed on the preburn-in DRAM module circuit board, which includes a burn-in circuit and a module circuit that allow the preburn-in DRAM modules to undergo the burn-in process when they are still mounted on the same printed circuit board (PCB)

In accordance with the foregoing and other objectives of the present invention, a preburn-in DRAM module circuit board and a structure for the associated DRAM modules are provided.

The preburn-in DRAM module circuit board of the invention is directly connectable to a burn-in oven for performing a burn-in process concurrently on a plurality of preburn-in DRAM modules mounted thereon. This preburn-in DRAM module circuit board is configured to provide at least one test area which includes:

(a) a plurality of serially connected preburn-in DRAM modules; and (b) a burn-in signal buffer/distributor, coupled to receive a burn-in signal from said burn-in oven, for transferring said burn-in signal to each of said plurality of preburn-in DRAM modules so as to perform a burn-in process concurrently on said plurality of preburn-in DRAM modules.

In a first preferred embodiment, each of the plurality of the above-mentioned preburn-in DRAM modules includes:

(a) a plurality of DRAM chips; and (b) a printed circuit board partitioned into a module region and a removable dummy region, said printed circuit board being a double-layer structure including:
  (i) a module circuit layer on which said DRAM chips are mounted in said module region;
  (ii) a burn-in circuit layer in which a burn-in circuit is arranged; and
  (iii) a ground plane formed between said module circuit layer and said burn-in circuit layer During a burn-in process, a burn-in signal is received and directed by said burn-in circuit in said burn-in circuit layer to be transferred through said dummy region of said printed circuit board to said module circuit layer and subsequently into said DRAM chips.

In another preferred embodiment, each of the plurality of preburn-in DRAM modules includes:

(a) a first array of DRAM chips;

(b) a second array of DRAM chips; and (c) a printed circuit board partitioned into a module region and a removable dummy region, said printed circuit board being a fourth-layer structure including:
  (i) a first module circuit layer on which the first array of DRAM chips are mounted in said module region;
  (ii) a first burn-in circuit layer beneath said first module circuit layer, in which a first burn-in circuit is arranged;
  (iii) a first ground plane formed between said first module circuit layer and said first burn-in circuit layer;
  (iv) a second burn-in circuit layer beneath said first burn-in circuit layer, in which a second burn-in circuit is arranged;
  (v) a second module circuit layer beneath said second burn-in circuit layer, on which the second array of DRAM chips are mounted in said module region; and
  (vi) a second ground plane formed between said second module circuit layer and said second burn-in circuit layer;

During a burn-in process, a burn-in signal is received and directed by said first burn-in circuit in said first burn-in circuit layer to be transferred through said dummy region of said printed circuit board to said first module circuit layer and subsequently into said first array of DRAM chips; and concurrently the burn-in signal is received and directed by said second burn-in circuit in said second burn-in circuit layer to be transferred through said dummy region of said printed circuit board to said second module circuit layer and subsequently into said second array of DRAM chips.

In order to prevent the so-called antenna effect, the removable dummy region is cut away after the burn-in and testing for the DRAM modules are completed, so as to expose the module pins on the edge of the DRAM module circuit board. Moreover, the DRAM chips can be mounted on the printed circuit board by various methods, such as package assembly, chip-on-board, and bare chip $C_4$ soldering.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In the following preferred embodiments, the invention is utilized for the purpose of performing a burn-in process concurrently on a plurality of DRAM modules. However, it is to be understood that the invention is not limited to such an application. Broadly speaking, the invention can be utilized for the purpose of performing a burn-in process concurrently on a plurality of IC (integrated circuit) modules.

Figure 2:
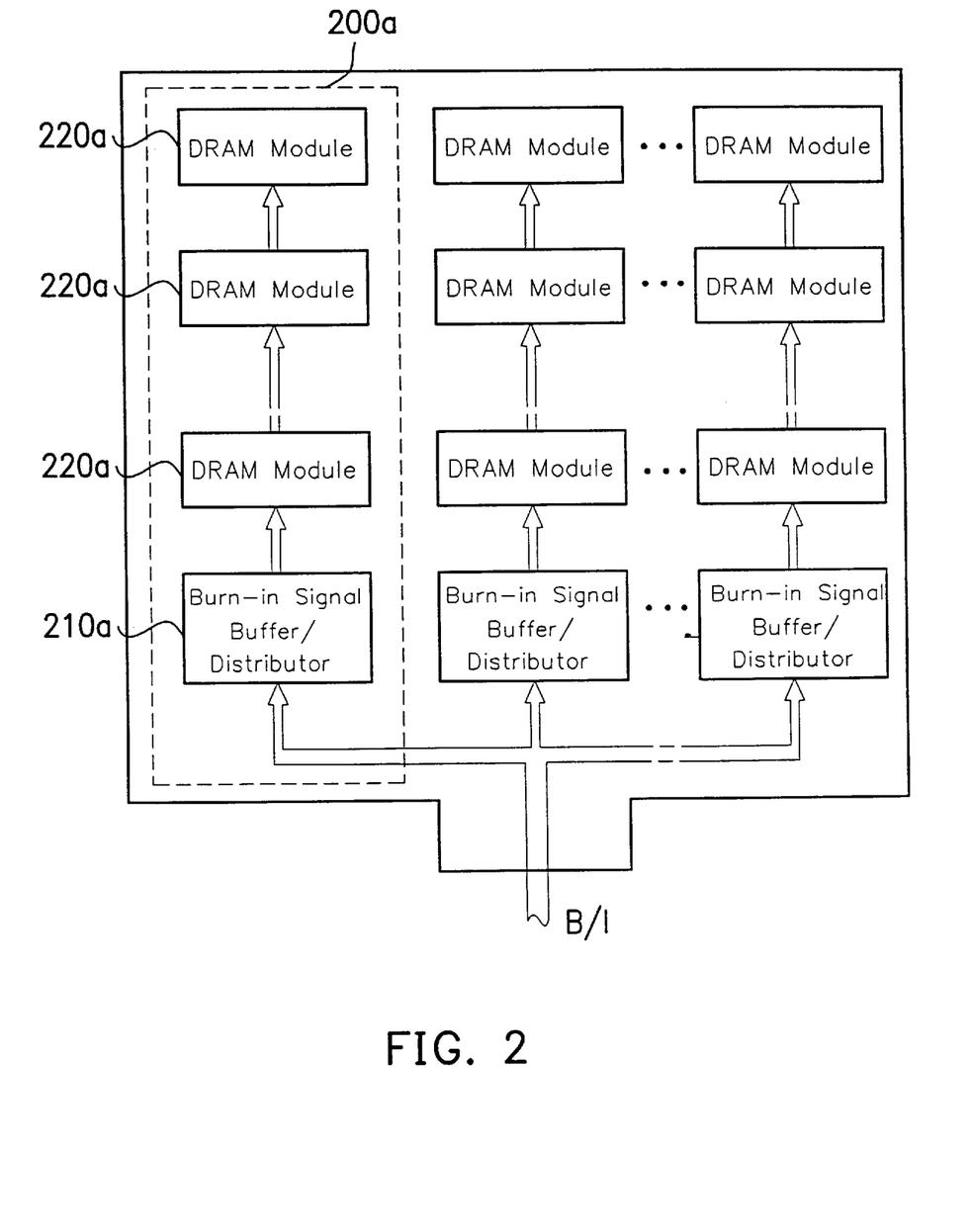
FIG. 2 is a schematic diagram showing the layout of an array of preburn-in DRAM modules on a preburn-in DRAM module circuit board according to the invention.

FIG. 2 is a schematic diagram showing the layout of an array of preburn-in DRAM modules on the preburn-in DRAM module circuit board according to the invention. As shown, the circuit layout includes an array of preburn-in DRAM modules 220a and a plurality of burn-in signal buffer/distributors 210a, which are arranged in such a manner that each column of the preburn-in DRAM modules 220a are connected in series to one of the burn-in signal buffer/distributors 210a. Further, these burn-in signal buffer/distributors 210a are connected together to receive a burn-in (B/I) signal via a common signal line from a burn-in oven (not shown).

At least one test area, as enclosed by a dashed box indicated by the reference numeral 200a, is designated on the preburn-in DRAM module circuit board of FIG. 2, which includes a number of preburn-in DRAM modules that are to be subject to a burn-in process. In this test area 200a, the received B/I signal is first buffered in and then distributed by the burn-in signal buffer/distributor 210a serially to the associated preburn-in DRAM modules 220a.

Figure 5:
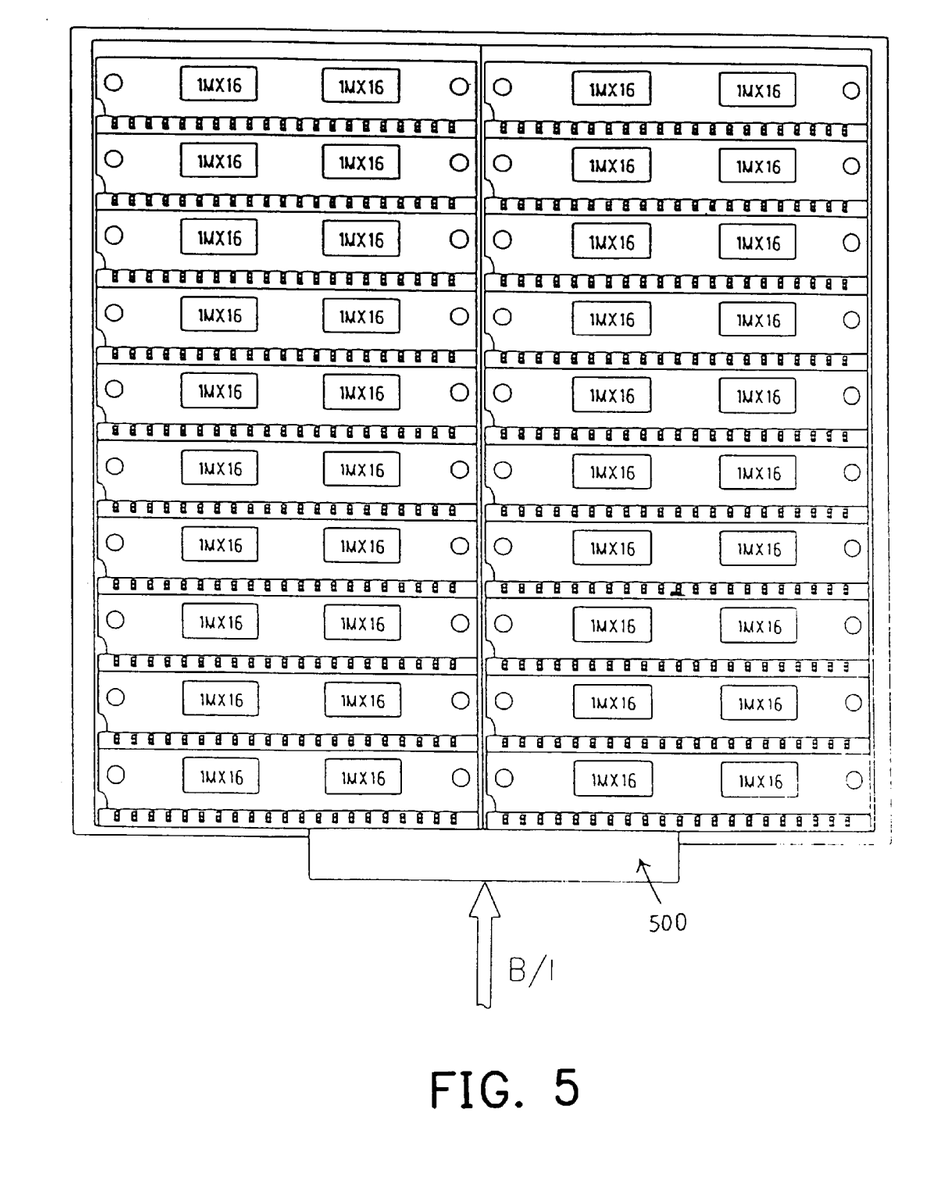
FIG. 5 is a top view of an example of the preburn-in DRAM module circuit board of the invention on which an array of 1M×16 DRAM modules are constructed.

A practical example of the preburn-in DRAM module circuit board for an array of 1M×16 DRAM modules is illustrated in FIG. 5. On the circuit board of FIG. 5, the above-mentioned burn-in signal buffer/distributors 210a are mounted in the area designated by the reference numeral 500 to receive the B/I signal from the burn-in oven (not shown).

In accordance with the objectives of the invention, each of the preburn-in DRAM modules 220a is provided with a module circuit on which the DRAM chips are mounted, and a burn-in circuit for distributing the B/I signal. Two preferred embodiments of the preburn-in DRAM module are disclosed in the following with reference to FIGS. 3 and 4 respectively.

Figure 3:
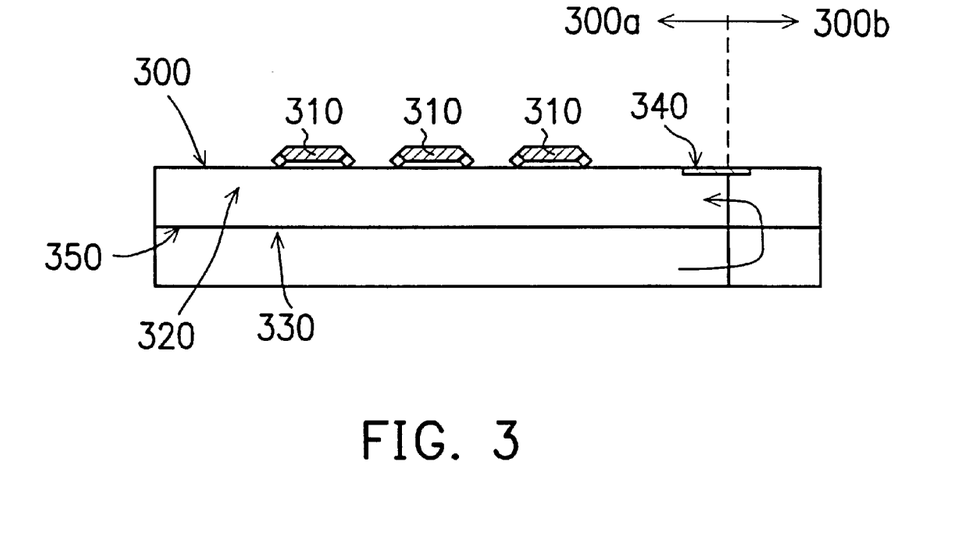
FIG. 3 is a schematic sectional diagram of a first preferred embodiment of each preburn-in DRAM module mounted on the preburn-in DRAM module circuit board of the invention.

FIG. 3 is a schematic sectional diagram of a first preferred embodiment of each of the preburn-in DRAM modules 220a, which is based on a SIMM (Single In-line Memory Module) structure. This preburn-in DRAM module is constructed on a printed circuit board (PCB) 300 which is partitioned into a module region, as designated by the reference numeral 300a, and a dummy region, as designated by the reference numeral 300b. On the module region 300a, an in-line row of surface-mount DRAM chips 310 are arranged.

The PCB 300 includes two layers: a module circuit layer 320 on which the DRAM chips 310 are mounted and a burn-in circuit layer 330 in which a burn-in circuit is arranged. These two layers 320, 330 are separated by a ground plane 350 which is connected to the ground. During the burn-in process, the B/I signal from the burn-in oven (not shown) is directed to the burn-in circuit layer 330 and onwards transferred through the dummy region 300b to the module circuit layer 320, and subsequently into the DRAM chips 310 mounted on the module circuit layer 320.

In order to prevent the so-called antenna effect, the dummy region 300b is cut away after the burn-in and testing for the DRAM chips 310 are completed, so as to expose the module pins 340 on the edge of the preburn-in DRAM module.

Figure 4:
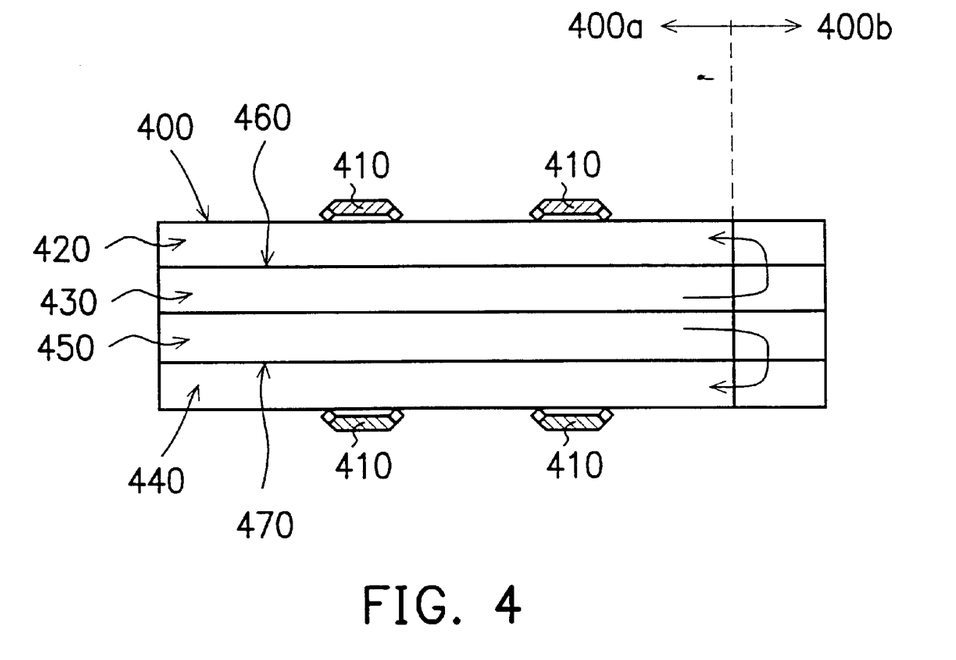
FIG. 4 is a schematic sectional diagram of a second preferred embodiment of each preburn-in DRAM module mounted on the preburn-in DRAM module circuit board of the invention.

FIG. 4 is a schematic sectional diagram of a second preferred embodiment of each of the preburn-in DRAM modules 220a, which is based on a DIMM (Dual In-line Memory Module) structure. This preburn-in DRAM module is constructed on a PCB 400 which is partitioned into a module region, as designated by the reference numeral 400a, and a dummy region, as designated by the reference numeral 400b. Two in-line rows of surface-mount DRAM chips 410 are arranged respectively on both sides of the PCB 400 in the module region 400a.

The PCB 400 includes four layers: a first module circuit layer 420 on which a first row of the DRAM chips 410 are mounted; a first burn-in circuit layer 430 in which a first burn-in circuit is arranged; a second module circuit layer 440 on which a second row of the DRAM chips 410 are arranged, and a second burn-in circuit layer 450 in which a second burn-in circuit is arranged. The first and second module circuit layers 420, 440 are arranged respectively on the two surface sides of the PCB 4C0. The first module circuit layer 420 and the first burn-in circuit layer 430 are separated by a first ground plane 460, while the second module circuit layer 440 and the second burn-in circuit layer 450 are separated by a second ground plane 470. The first and second ground planes 460, 470 are connected to the ground.

During the burn-in process, the B/I signal is directed to both of the first and second burn-in circuit layers 430, 450. The first burn-in circuit layer 430 then directs the B/I signal through the dummy region 400b to the first module circuit layer 420, and subsequently into the first row of DRAM chips 410 mounted on the first module circuit layer 420; and concurrently, the second burn-in circuit layer 450 directs the B/I signal also through the dummy region 400b to the second module circuit layer 440, and subsequently into the is second row of DRAM chips 410 mounted on the second module circuit layer 440.

In order to prevent the so-called antenna effect, the dummy region 400b is cut away after the burn-in and testing for the DRAM chips 410 are completed.

In still other various embodiments, the above-mentioned module circuit layer 320, burn-in circuit layer 330, first module circuit layer 420, first burn-in circuit layer 430, second module circuit layer 440, and second burn-in circuit layer 450 can be each formed into a multi-layer structure, such as a four-layer structure, depending on the complexity and available layout area on the PCB.

Figure 6A:
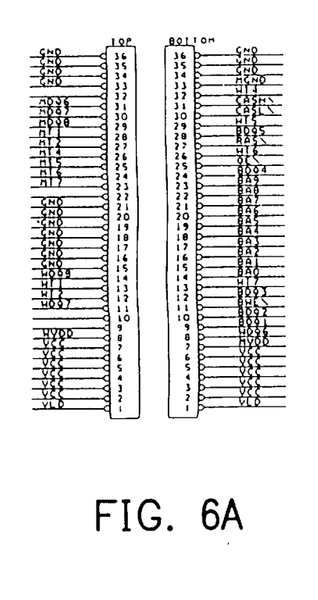
FIG. 6A shows an example of the pin assignment for the preburn-in DRAM module circuit board of the invention for connection to a burn-in oven.
Figure 6B:
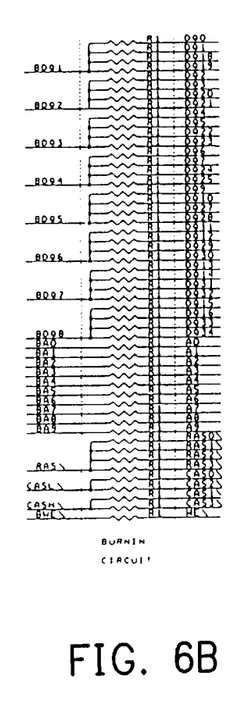
FIG. 6B shows an example of the layout of the burn-in circuit used in the preburn-in DRAM module circuit board of the invention.
Figures 6C, 6D:
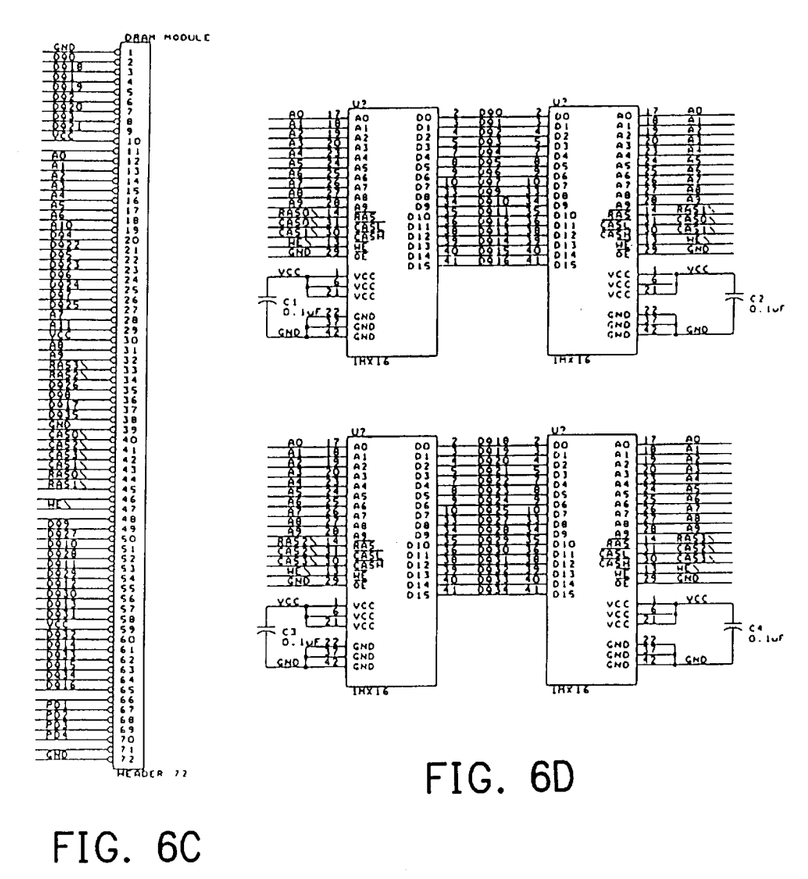
FIG. 6C shows an example of the pin assignment for the preburn-in DRAM module circuit board of the invention.
FIG. 6D shows the circuit layout of a 2M×32 DRAM module which is constructed from two 1M×16 DRAM chips.

FIG. 6A shows an example of the pin assignment for the preburn-in DRAM module circuit board of the invention for connection to a burn-in oven; FIG. 6B shows an example of the layout of the burn-in circuit used in the preburn-in DRAM module circuit board of the invention; FIG. 6C shows an example of the pin assignment for the preburn-in DRAM module circuit board of the invention; and FIG. 6D shows the circuit layout of a 2M×32 DRAM module which is constructed from two 1 M×16 DRAM chips.

In conclusion, the invention allows the manufacturing process for the DRAM modules to be simplified down to the following steps: (1) wafer sorting (CP testing), (2) IC package assembly, (3) final testing-1, (4) package assembly on board, (5) burn-in, (6) module testing, (7) rework, (8) cut into separate modules, and (9) shipping. Alternatively, the chip-on-board process can be used to substitute for the foregoing steps (2) through (4). Moreover, various packaging techniques, the chip-on-board technique, and the bare chip (such as $C_4$ soldering) technique can be included in the invention.

The preburn-in DRAM module circuit board of the invention allows a plurality of DRAM modules to be constructed directly thereon, and which can be directly connected to a large burn-in oven so as to perform a burn-in process concurrently on the DRAM modules mounted thereon so as to check for any defected IC chips that are to be reworked. The invention allows the manufacturing process for the DRAM modules to be reduced in schedule and manufacturing cost. The products of the DRAM modules would thus be competitive on the market.

As mentioned in the beginning of this section, the invention is not limited to the utilization on DRAM modules, but to other various IC modules, such as flash memory modules.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A preburn-in DRAM module, comprising:

a plurality of DRAM chips; and a printed circuit board partitioned into a module region and a removable dummy region, said printed circuit board being a double-layer structure including:
a module circuit layer on which said DRAM chips are mounted in said module region;
a burn-in circuit layer in which a burn-in circuit is arranged; and
a ground plane formed between said module circuit layer and said burn-in circuit layer;

wherein during a burn-in process, a burn-in signal is received and directed by said burn-in circuit in said burn-in circuit layer to be transferred through said dummy region of said printed circuit board to said module circuit layer and subsequently into said DRAM chips.

2. The preburn-in DRAM module of claim 1, wherein said DRAM chips are mounted on said printed circuit board in packaged form.

3. The preburn-in DRAM module of claim 1, wherein said DRAM chips are mounted on said printed circuit board through a chip-on-board method.

4. The preburn-in DRAM module of claim 1, wherein said DRAM chips are mounted on said printed circuit board through a bare-chip $C_4$ soldering method.

5. A preburn-in DRAM module, comprising:

a first array of DRAM chips;

a second array of DRAM chips; and a printed circuit board partitioned into a module region and a removable dummy region, said printed circuit board being a fourth-layer structure including:
a first module circuit layer on which the first array of DRAM chips are mounted in said module region;
a first burn-in circuit layer beneath said first module circuit layer, in which a first burn-in circuit is arranged;
a first ground plane formed between said first module circuit layer and said first burn-in circuit layer;
a second burn-in circuit layer beneath said first burn-in circuit layer, in which a second burn-in circuit is arranged;
a second module circuit layer beneath said second burn-in circuit layer, on which the second array of DRAM chips are mounted in said module region; and
a second ground plane formed between said second module circuit layer and said second burn-in circuit layer;

wherein during a burn-in process, a burn-in signal is received and directed by said first burn-in circuit in said first burn-in circuit layer to be transferred through said dummy region of said printed circuit board to said first module circuit layer and subsequently into said first array of DRAM chips; and concurrently the burn-in signal is received and directed by said second burn-in circuit in said second burn-in circuit layer to be transferred through said dummy region of said printed circuit board to said second module circuit layer and subsequently into said second array of DRAM chips.

6. The preburn-in DRAM module of claim 5, wherein said DRAM chips are mounted on said printed circuit board in packaged form.

7. The preburn-in DRAM module of claim 5, wherein said DRAM chips are mounted on said printed circuit board through a chip-on-board method.

8. The preburn-in DRAM module of claim 5, wherein said DRAM chips are mounted on said printed circuit board through a bare-chip $C_4$ soldering method.

9. A preburn-in DRAM module circuit board which is directly connectable to a burn-in oven, comprising:
   at least one test area including:
      a plurality of serially connected preburn-in DRAM modules; and
      a burn-in signal buffer/distributor, coupled to receive a burn-in signal from said burn-in oven, for transferring said burn-in signal to each of said plurality of preburn-in DRAM modules so as to perform a burn-in process concurrently on said plurality of preburn-in DRAM modules.

10. The circuit board of claim 9, wherein each of said plurality of preburn-in DRAM modules comprises:
   a plurality of DRAM chips; and
   a printed circuit board partitioned into a module region and a removable dummy region, said printed circuit board being a double-layer structure including:
      a module circuit layer on which said DRAM chips are mounted in said module region;
      a burn-in circuit layer in which a burn-in circuit is arranged; and
      a ground plane formed between said module circuit layer and said burn-in circuit layer;
   wherein during a burn-in process, the burn-in signal is received and directed by said burn-in circuit in said burn-in circuit layer to be transferred through said dummy region of said printed circuit board to said module circuit layer and subsequently into said DRAM chips.

11. The circuit board of claim 9, wherein each of said plurality of preburn-in DRAM modules comprises:
   a first array of DRAM chips;
   a second array of DRAM chips; and
   a printed circuit board partitioned into a module region and a removable dummy region, said printed circuit board being a fourth-layer structure including:
      a first module circuit layer on which the first array of DRAM chips are mounted in said module region;
      a first burn-in circuit layer beneath said first module circuit layer, in which a first burn-in circuit is arranged;
      a first ground plane formed between said first module circuit layer and said first burn-in circuit layer;
      a second burn-in circuit layer beneath said first burn-in circuit layer, in which a second burn-in circuit is arranged;
      a second module circuit layer beneath said second burn-in circuit layer, on which the second array of DRAM chips are mounted in said module region; and
      a second ground plane formed between said second module circuit layer and said second burn-in circuit layer;

wherein during a burn-in process, the burn-in signal is received and directed by said first burn-in circuit in said first burn-in circuit layer to be transferred through said dummy region of said printed circuit board to said first module circuit layer and subsequently into said first array of DRAM chips; and concurrently the burn-in signal is received and directed by said second burn-in circuit in said second burn-in circuit layer to be transferred through said dummy region of said printed circuit board to said second module circuit layer and subsequently into said second array of DRAM chips.

12. A preburn-in IC module circuit board which is directly connectable to a burn-in oven, comprising:
   at least one test area including:
      a plurality of serially connected preburn-in IC modules; and
      a burn-in signal buffer/distributor, coupled to receive a burn-in signal from said burn-in oven, for transferring said burn-in signal to each of said plurality of preburn-in IC modules so as to perform a burn-in process concurrently on said plurality of preburn-in IC modules.

13. The circuit board of claim 12, wherein each of said plurality of preburn-in IC modules comprises:
   a plurality of IC chips; and
   a printed circuit board partitioned into a module region and a removable dummy region, said printed circuit board being a double-layer structure including:
      a module circuit layer on which said IC chips are mounted in said module region;
      a burn-in circuit layer in which a burn-in circuit is arranged; and
      a ground plane formed between said module circuit layer and said burn-in circuit layer;
   wherein during a burn-in process, the burn-in signal is received and directed by said burn-in circuit in said burn-in circuit layer to be transferred through said dummy region of said printed circuit board to said module circuit layer and subsequently into said IC chips.

14. The circuit board of claim 12, wherein each of said plurality of preburn-in IC modules comprises:
   a first array of IC chips;
   a second array of IC chips; and
   a printed circuit board partitioned into a module region and a removable dummy region, said printed circuit board being a fourth-layer structure including:
      a first module circuit layer on which the first array of IC chips are mounted in said module region;
      a first burn-in circuit layer beneath said first module circuit layer, in which a first burn-in circuit is arranged;
      a first ground plane formed between said first module circuit layer and said first burn-in circuit layer;
      a second burn-in circuit layer beneath said first burn-in circuit layer, in which a second burn-in circuit is arranged;

a second module circuit layer beneath said second burn-in circuit layer, on which the second array of IC chips are mounted in said module region; and a second ground plane formed between said second module circuit layer and said second burn-in circuit layer;

wherein during a burn-in process, the burn-in signal is received and directed by said first burn-in circuit in said first burn-in circuit layer to be transferred through said dummy region of said printed circuit board to said first module circuit layer and subsequently into said first array of IC chips; and concurrently the burn-in signal is received and directed by said second burn-in circuit in said second burn-in circuit layer to be transferred through said dummy region of said printed circuit board to said second module circuit layer and subsequently into said second array of IC chips.

* * * * *

UNITED STATES PATENT AND TRADEMARK OFFICE
CERTIFICATE OF CORRECTION

PATENT NO. : 6,279,141 B1
DATED : August 21, 2001
INVENTOR(S) : Min-Chih Hsuan et al.

It is certified that error appears in the above-identified patent and that said Letters Patent is hereby corrected as shown below:

<u>Title page,</u>
Insert the following -- [73] Assignee:   United Microelectronics Corporation, Hsinchu City, Taiwan --.

Signed and Sealed this

Third Day of June, 2003

JAMES E. ROGAN
*Director of the United States Patent and Trademark Office*